(12) United States Patent
Cheng et al.

(10) Patent No.: US 11,877,381 B2
(45) Date of Patent: Jan. 16, 2024

(54) HEAT DISSIPATING SYSTEM

(71) Applicants: Inventec (Pudong) Technology Corporation, Shanghai (CN); INVENTEC CORPORATION, Taipei (TW)

(72) Inventors: Yi-Lun Cheng, Taipei (TW); Chih Kai Yang, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 17/812,723

(22) Filed: Jul. 15, 2022

(65) Prior Publication Data

US 2023/0397363 A1    Dec. 7, 2023

(30) Foreign Application Priority Data

Jun. 2, 2022   (CN) .......................... 202210623778.2

(51) Int. Cl.
*H05K 7/20* (2006.01)
(52) U.S. Cl.
CPC ..... *H05K 7/20154* (2013.01); *H05K 7/20172* (2013.01); *H05K 7/20336* (2013.01)
(58) Field of Classification Search
CPC ........... H05K 7/20154; H05K 7/20172; H05K 7/20336
See application file for complete search history.

(56) References Cited

U.S. PATENT DOCUMENTS

| 10,423,200 | B1* | 9/2019 | North | G06F 1/1616 |
| 10,969,838 | B2* | 4/2021 | He | G06F 1/203 |
| 2015/0116928 | A1* | 4/2015 | Delano | H01L 23/467 |
| | | | | 361/679.47 |
| 2019/0050031 | A1* | 2/2019 | Utz | H05K 7/20327 |
| 2020/0396864 | A1* | 12/2020 | Ku | G06F 1/203 |

FOREIGN PATENT DOCUMENTS

| TW | M502876 U | 6/2015 |
| TW | 201925954 A | 7/2019 |
| TW | 202131783 A | 8/2021 |
| TW | M620617 U | 12/2021 |
| TW | I763256 B | 5/2022 |

* cited by examiner

*Primary Examiner* — Mukundbhai G Patel
(74) *Attorney, Agent, or Firm* — CKC & Partners Co., LLC

(57) ABSTRACT

A heat dissipating system for electronic devices includes a first heat dissipation device, a second heat dissipation device, and a thermal conduction component. The thermal conduction component is disposed around the first heat dissipation device and configured to thermally contact a heat source. The second heat dissipation device is disposed adjacent to the thermal conduction component. The first heat dissipation device is configured to generate a first working fluid toward the thermal conduction component, such that the heat transferred from the heat source to the thermal conduction component is dispersed in a plurality of directions directing away from the first heat dissipation device. The second heat dissipation device is configured to generate a second working fluid, such that the heat distributed adjacent to the second heat dissipation device is dissipated in at least one direction directing away from the second heat dissipation device.

8 Claims, 7 Drawing Sheets

HEAT DISSIPATING SYSTEM

CROSS-REFERENCE TO RELATED APPLICATION

This application claims priority to China Application Serial Number 202210623778.2, filed Jun. 2, 2022, which is herein incorporated by reference.

BACKGROUND

Technical Field

The present disclosure relates to a heat dissipating system, and more particularly, to a heat dissipating system used in an electronic device.

Description of Related Art

The advancement of high-performance electronic devices has increased the demand for high-efficiency heat dissipation, especially for gaming laptops.

As processor performance improves, the heat dissipating system of gaming laptops has therefore become more complicated and bulky to enhance heat dissipation and prevent overheating. Therefore, the thickness of gaming laptops is greater than that of ordinary laptops. The weight of gaming laptops is also greater, leading to less portability.

Accordingly, how to provide a heat dissipating system for electronic devices such as gaming laptops which solve the aforementioned problems has become an important issue to be solved by those in the industry.

SUMMARY

An aspect of the disclosure is to provide a heat dissipating system that may efficiently solve the aforementioned problems.

According to an embodiment of the disclosure, a heat dissipating system includes a first heat dissipation device, a thermal conduction component, and a second heat dissipation device. The thermal conduction component is disposed around the first heat dissipation device. The thermal conduction component is configured to thermally contact a heat source. The second heat dissipation device is disposed adjacent to the thermal conduction component. The first heat dissipation device is configured to generate a first working fluid toward the thermal conduction component, such that the heat transferred from the heat source to the thermal conduction component is dispersed in a plurality of directions directing away from the first heat dissipation device. The second heat dissipation device is configured to generate a second working fluid, such that the heat distributed adjacent to the second heat dissipation device is dissipated in at least one direction directing away from the second heat dissipation device.

In an embodiment of the disclosure, the at least one direction directing away from the second heat dissipation device is at least one direction directing toward the thermal conduction component.

In an embodiment of the disclosure, the at least one direction directing away from the second heat dissipation device is at least one direction directing away from the thermal conduction component.

In an embodiment of the disclosure, the thermal conduction component further includes a heat conducting element extending to the second heat dissipation device and a heat exchanger adjacent to the second heat dissipation device. The second working fluid flows through the heat exchanger.

In an embodiment of the disclosure, the heat dissipating system further includes a first block body disposed between the thermal conduction component and the second heat dissipation device.

In an embodiment of the disclosure, the thermal conduction component includes a vapor chamber, a heat pipe, a graphite sheet, or a highly conductive metal.

In an embodiment of the disclosure, the thermal conduction component fully encircles the first heat dissipation device.

In an embodiment of the disclosure, the thermal conduction component partially encircles the first heat dissipation device.

In an embodiment of the disclosure, the thermal conduction component is disposed between the first heat dissipation device and the second heat dissipation device.

In an embodiment of the disclosure, the first heat dissipation device is an open-type centrifugal fan. The open-type centrifugal fan includes at least one axial air inlet opening and a plurality of radial air outlet openings. The radial air outlet openings correspond to the plurality of directions directing away from the first heat dissipation device.

In an embodiment of the disclosure, the second heat dissipation device is an enclosed-type centrifugal fan. The enclosed-type centrifugal fan includes at least one axial air inlet opening and at least one side air outlet opening.

In an embodiment of the disclosure, the enclosed-type centrifugal fan further includes a fan housing and a second block body. The fan housing has the at least one axial air inlet opening and the at least one side air outlet opening. The second block body surrounds the fan housing.

In an embodiment of the disclosure, the enclosed-type centrifugal fan further includes a fan housing and a plurality of third block bodies. The fan housing has the at least one axial air inlet opening and the at least one side air outlet opening. The plurality of third block bodies are disposed at the fan housing and around outer edges of the at least one axial air inlet opening.

Accordingly, in the heat dissipating system of the present disclosure, with the first heat dissipation device generating the first working fluid, the thermal conduction component disperses the heat from the heat source. The second heat dissipation device further generates the second working fluid to direct the heat along some specific directions. The heat conducting elements extending from the thermal conduction component further disperse the heat from the thermal conduction component and guide the heat to paths through which the second working fluid passes. In addition, the first block body between the thermal conduction component and the second heat dissipation device enables the first and second heat dissipation devices to have independent (thermal) flow fields. Therefore, unnecessary heat transfer may reduce, which prevents the hot air from circulating in the system and avoid the subsequent decrease in heat dissipation efficiency. Overall, compared with the present heat dissipating systems commonly used, the heat dissipating system of the present disclosure can enhance heat dissipation and prevent overheating of electronic devices.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
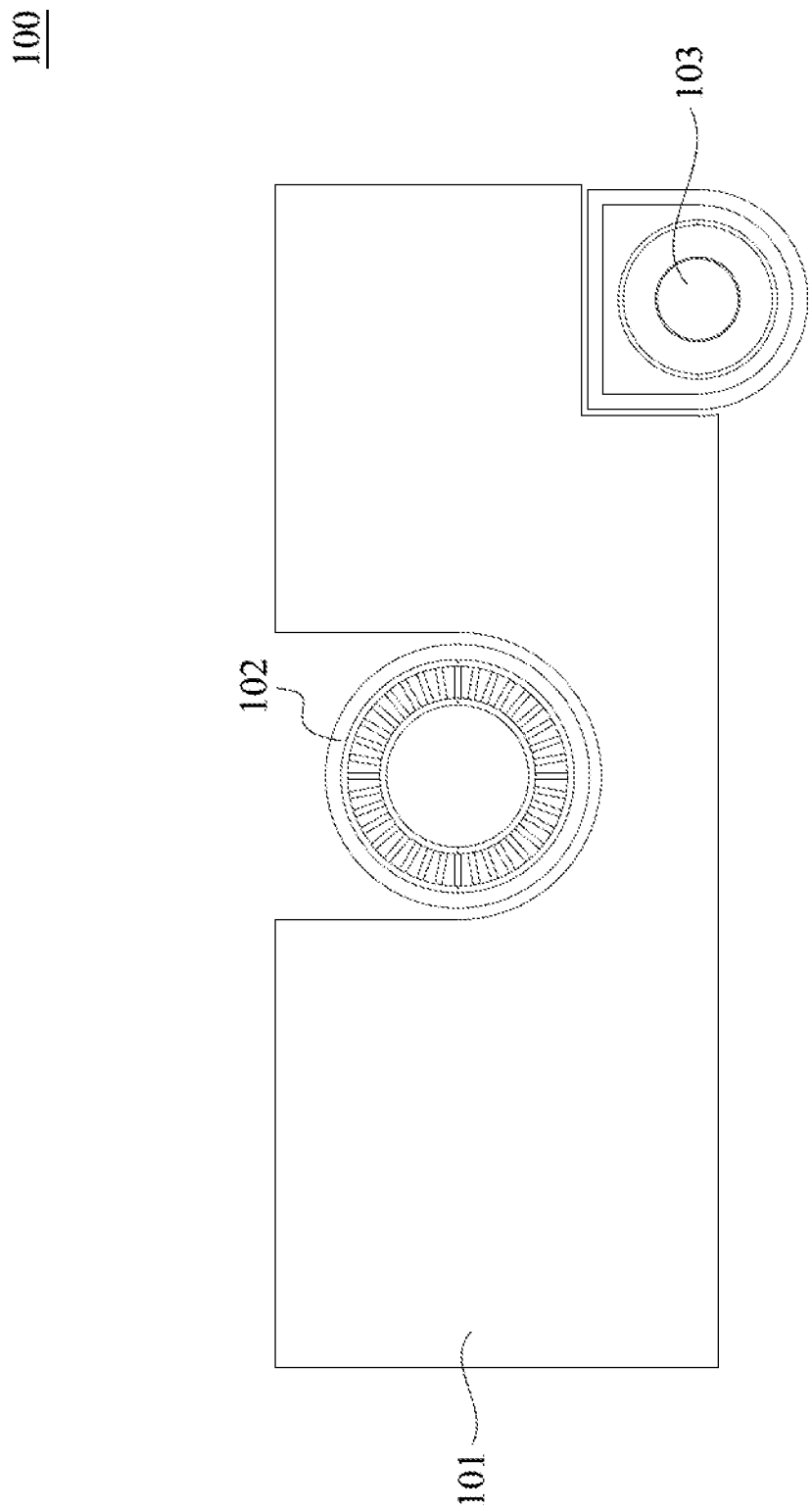
FIG. 1 is a top view of a heat dissipating system according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 5:
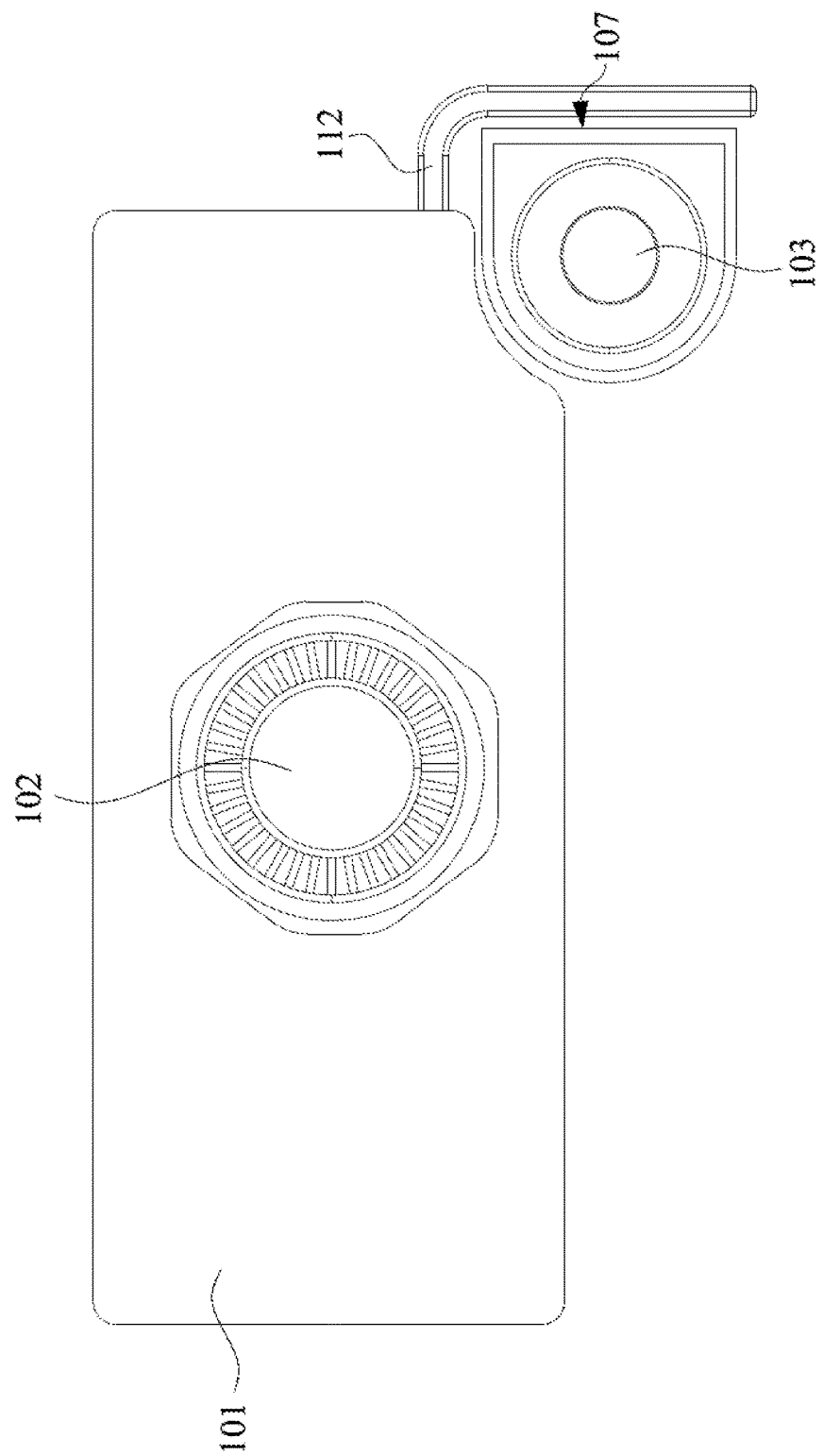
FIG. 5 is a top view of a heat dissipating system according to another embodiment of the present disclosure.

Reference is made to FIG. 1. FIG. 1 is a top view of a heat dissipating system 100 according to some embodiments of the present disclosure. As shown in FIG. 1, the heat dissipating system 100 includes a thermal conduction component 101, a first heat dissipation device 102, and a second heat dissipation device 103. The thermal conduction component 101 is disposed between the first heat dissipation device 102 and the second heat dissipation device 103. In some embodiments, the thermal conduction component 101 is disposed around the first heat dissipation device 102. As shown in FIG. 1, the thermal conduction component 101 partially encircles the first heat dissipation device 102. In some embodiments, the thermal conduction component 101 fully encircles the first heat dissipation device 102 (referring to FIG. 5). The second heat dissipation device 103 is disposed adjacent to the thermal conduction component 101. Referring to FIG. 1 and FIG. 5, the second heat dissipation device 103 is adjacent to the edge of the thermal conduction component 101 opposite to the first heat dissipation device 102.

The thermal conduction component 101 is configured to thermally contact a heat source of an electronic device. The number of heat sources is including but not limited to one. If there are two heat sources, they are disposed on opposite sides of the first heat dissipation device 102 to avoid accumulating the heat they generate. Similarly, if there are more than two heat sources, they are arranged around the first heat dissipation device 102. In the embodiments of the present disclosure, the electronic device may be, but not limited to, a portable electronic device, such as a laptop or a palmtop computer.

The thermal conduction component 101 can be a vapor chamber, a heat pipe, a graphite sheet, a highly conductive metal, a combination thereof, or a similar component that can absorb and distribute the heat. It should be understood that the thermal conduction component 101 can have different shapes and configurations in accordance with the first heat dissipation device 102, the second heat dissipation device 103, and the structure outside the system while remaining within the scope of the present disclosure.

Figure 2B:
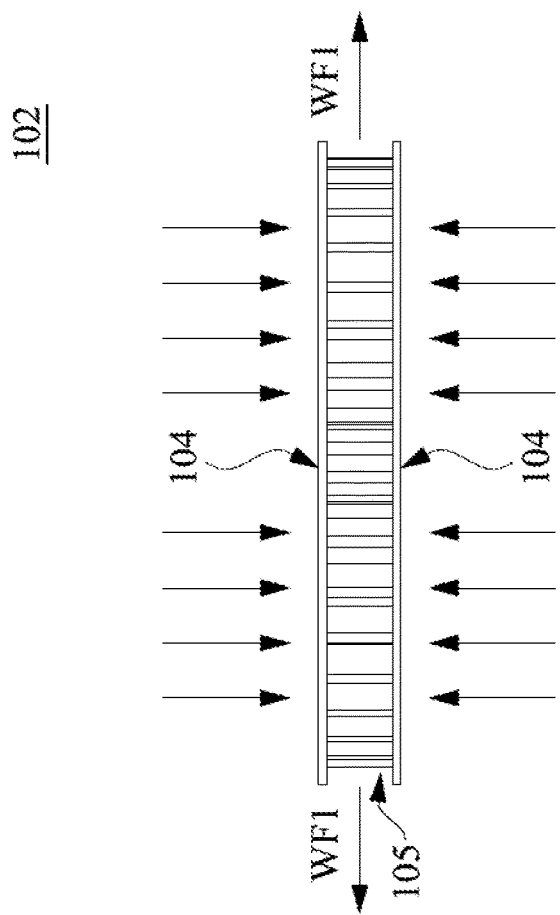
FIG. 2B is a side view of a first heat dissipation device according to an embodiment of the present disclosure.
Figure 2A:
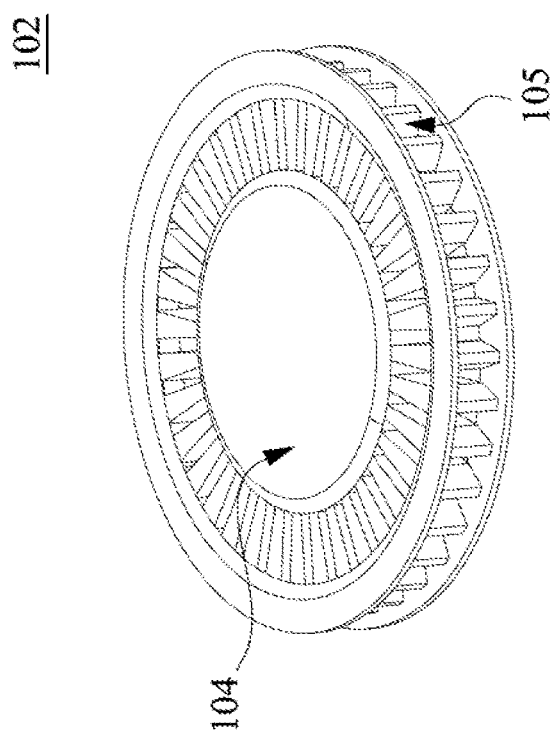
FIG. 2A is a perspective view of a first heat dissipation device according to an embodiment of the present disclosure.

Reference is made to FIG. 2A and FIG. 2B, which illustrate a perspective view and a side view of a first heat dissipation device 102 according to some embodiments of the present disclosure, respectively. According to such embodiment, the first heat dissipation device 102 is an open-type centrifugal fan. The open-type centrifugal fan includes at least one axial air inlet opening 104 and a plurality of radial air outlet openings 105. The radial air outlet openings 105 correspond to the plurality of directions directing away from the first heat dissipation device 102. For example, as shown in FIG. 2B, the open-type centrifugal fan has two axial air inlet openings 104 and several radial air outlet openings 105. The open-type centrifugal fan takes in cold air from outside the system through the two axial air inlet openings 104. Then, the cold air is blown out in different outlet directions to the thermal conduction component 101 through the radial air outlet openings 105 (as shown by the arrows indicating the first working fluid WF1 in FIG. 2B). In the embodiments of the present disclosure, the first heat dissipation device 102 may be, but not limited to, an open-type centrifugal fan.

Figure 3A:
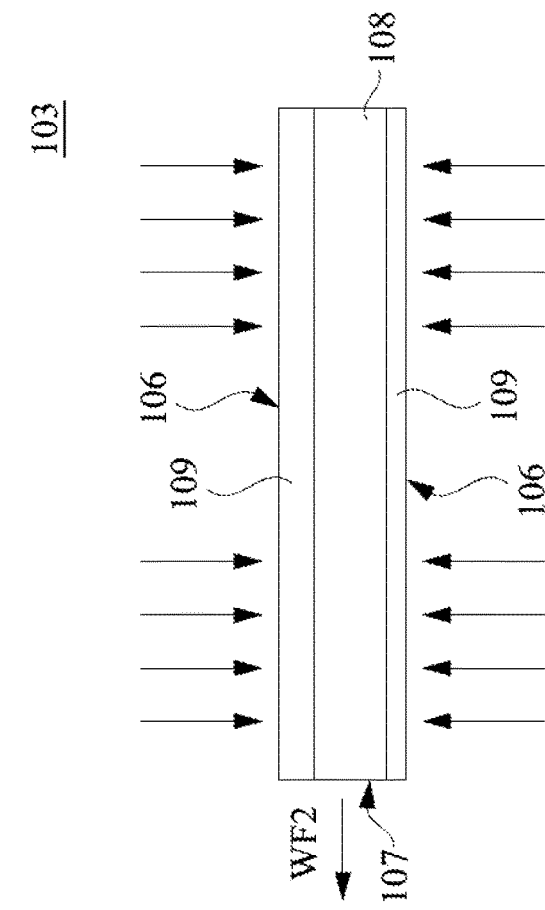
FIG. 3A is a perspective view of a second heat dissipation device according to an embodiment of the present disclosure.
Figure 3B:
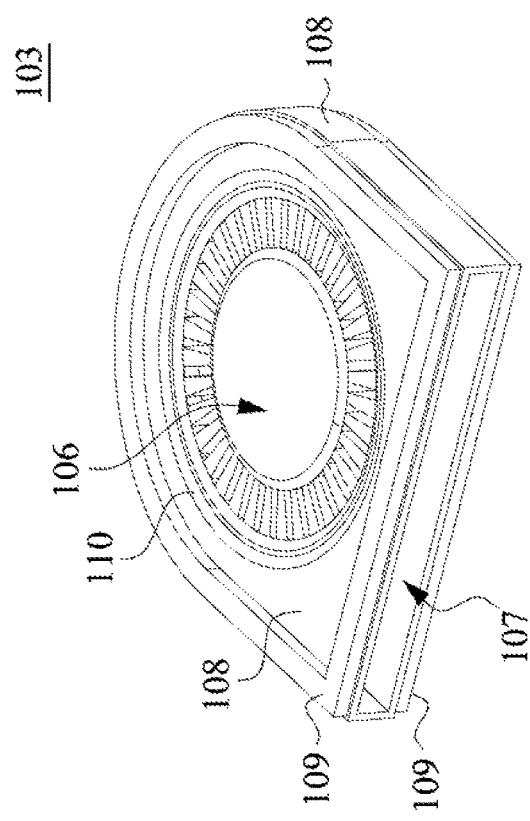
FIG. 3B is a side view of a second heat dissipation device according to an embodiment of the present disclosure.

Reference is made to FIG. 3A and FIG. 3B, which illustrate a perspective view and a side view of a second heat dissipation device 103 according to some embodiments of the present disclosure, respectively. In such embodiment, the second heat dissipation device 103 is an enclosed-type centrifugal fan. The enclosed-type centrifugal fan includes at least one axial air inlet opening 106 and at least one side air outlet opening 107. For example, as shown in FIG. 3B, the enclosed-type centrifugal fan has two axial air inlet openings 106 and one side air outlet opening 107. The enclosed-type centrifugal fan takes in cold air from outside the system through the two axial air inlet openings 106. Then, the cold air blows in the outlet directions through the side air outlet opening 107 (as shown by the arrow indicating the second working fluid WF2 in FIG. 3B). In the embodiments of the present disclosure, the second heat dissipation device 103 may be, but not limited to, an enclosed-type centrifugal fan.

In some embodiments, the second heat dissipation device 103 further includes a fan housing 108 and a second block body 109. The fan housing 108 has at least one axial air inlet opening 106 and at least one side air outlet opening 107. For example, as shown in FIG. 3A and FIG. 3B, the fan housing 108 has two axial air inlet openings 106 and one side air outlet opening 107. The second block body 109 surrounds the fan housing 108. The second block body 109 is configured to hinder the heat carried by portions of the thermal conduction component 101 adjacent to the second heat dissipation device 103 from heating the second heat dissipation device 103. If the heating occurs, it may cause the cold air introduced by the second heat dissipation device 103 to be heated and reduce the heat dissipation efficiency.

In some embodiments, the second heat dissipation device 103 further includes a fan housing 108 and a plurality of third block bodies 110. As shown in FIG. 3A, the third block bodies 110 are disposed at the fan housing 108 and around outer edges of the two axial air inlet openings 106. The purpose of the third block bodies 110 is to ensure that the air introduced by the two axial air inlet opening 106 comes primarily from outside the system rather than from the relatively hot air circulating near the second heat dissipation device 103. Although FIG. 3A shows that the third block bodies 110 are annular, it should be understood that the third block bodies 110 may have different shapes and configurations according to flow field characteristics while remaining within the scope of the present disclosure.

In the drawings of the present disclosure, the first heat dissipation device 102 is shown to be an open-type centrifugal fan as an example, and the second heat dissipation device 103 is shown to be an enclosed-type centrifugal fan as an example.

Reference is made back to FIG. 1. The first heat dissipation device 102 takes in cold air from outside the system. The introduced cold air blows radially to the thermal conduction component 101 in different outlet directions. The cold air facilitates the heat dispersion from the heat source to all portions of the thermal conduction component 101. Meanwhile, the cold air introduced by the second heat dissipation device 103 exchanges heat with the thermal conduction component 101. As the cold air absorbs heat, the heat adjacent to the second heat dissipation device 103 is dissipated outward along the outlet direction of the second heat dissipation device 103.

Although FIG. 1 only shows one first heat dissipation device 102 and one second heat dissipation device 103, it should be understood that the heat dissipating system 100 may include any number of the first heat dissipation devices 102 and the second heat dissipation devices 103 while remaining within the scope of the present disclosure.

Figure 4:
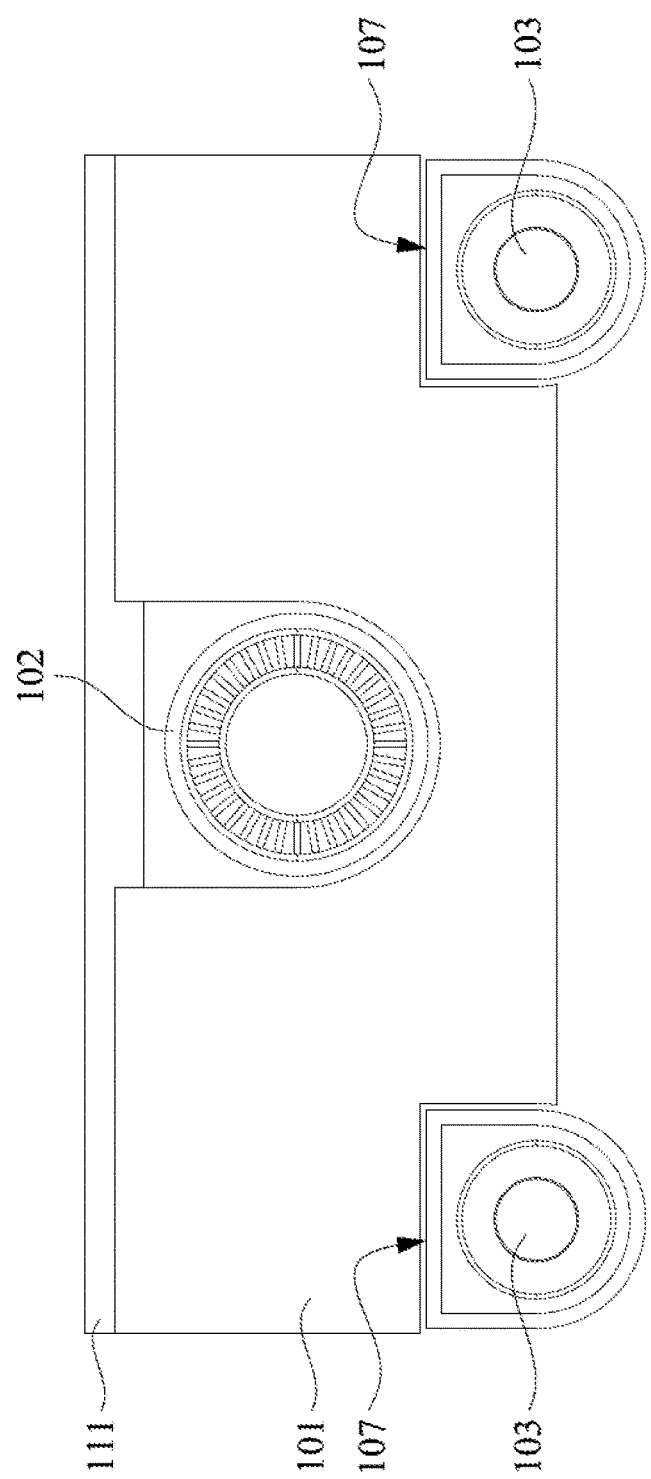
FIG. 4 is a top view of a heat dissipating system according to an embodiment of the present disclosure.

For example, FIG. 4 illustrates a top view of a heat dissipating system 100' according to some embodiments of the present disclosure. As shown in FIG. 4, the heat dissipating system 100' includes one thermal conduction component 101, one first heat dissipation device 102, two second heat dissipation devices 103, and one heat exchanger 111. Specifically, the first heat dissipation device 102 blows cold air to the thermal conduction component 101 in different outlet directions. The cold air facilitates the heat dispersion from the heat source to the thermal conduction component 101. Meanwhile, the cold air introduced by the second heat dissipation devices 103 exchanges heat with the thermal conduction component 101. In addition, as shown in FIG. 4, the outlet directions of the second heat dissipation devices 103 direct toward the heat exchanger 111 (for example, a heat dissipating fin). In this case, the cold air flow promotes the heat dissipation from the heat exchanger 111 and accelerates the convection near the thermal conduction component 101.

Therefore, the heat accumulation in the dead zone of the thermal flow field reduces.

In some embodiments, the outlet direction of the second heat dissipation device 103 is a direction directing away from the thermal conduction component 101. In such embodiment, the cold air of the second heat dissipation device 103 does not directly exchange heat with the thermal conduction component 101. Instead, the cold air exchanges heat with a heat conducting element extending from the thermal conduction component 101 (for example, the heat conducting element 112) and a heat exchanger (for example, the heat exchanger 113). Therefore, the first heat dissipation device 102 and the second heat dissipation device 103 have independent (thermal) flow fields, which prevent the hot air from circulating in the system and avoid the subsequent decrease in heat dissipation efficiency.

For example, FIG. 5 illustrates a top view of a heat dissipating system 200 according to some other embodiments of the present disclosure. In such embodiment, the outlet direction of the second heat dissipation device 103 directs away from the thermal conduction component 101. As shown in FIG. 5, the outlet direction is perpendicular to the minor axis of the thermal conduction component 101. The thermal conduction component 101 further includes a heat conducting element 112. The heat conducting element 112 extends to the outside of the side air outlet opening 107 of the second heat dissipation device 103. The cold air introduced by the second heat dissipation device 103 exchanges heat with the heat conducting element 112. In addition, as mentioned above, the second heat dissipation device 103 may further include a second block body 109 to hinder the heat carried by portions of the thermal conduction component 101 adjacent to the second heat dissipation device 103. As such, the first heat dissipation device 102 and the second heat dissipation device 103 have independent (thermal) flow fields, which conduct and discharge heat in different directions.

Similarly, although FIG. 5 shows only one first heat dissipation device 102, one second heat dissipation device 103, and one heat conducting element 112, it should be understood that the heat dissipating system 200 may include any number of the first heat dissipation device 102, the second heat dissipation device 103, and the heat conducting element 112 while remaining within the scope of the present disclosure.

Figure 6:
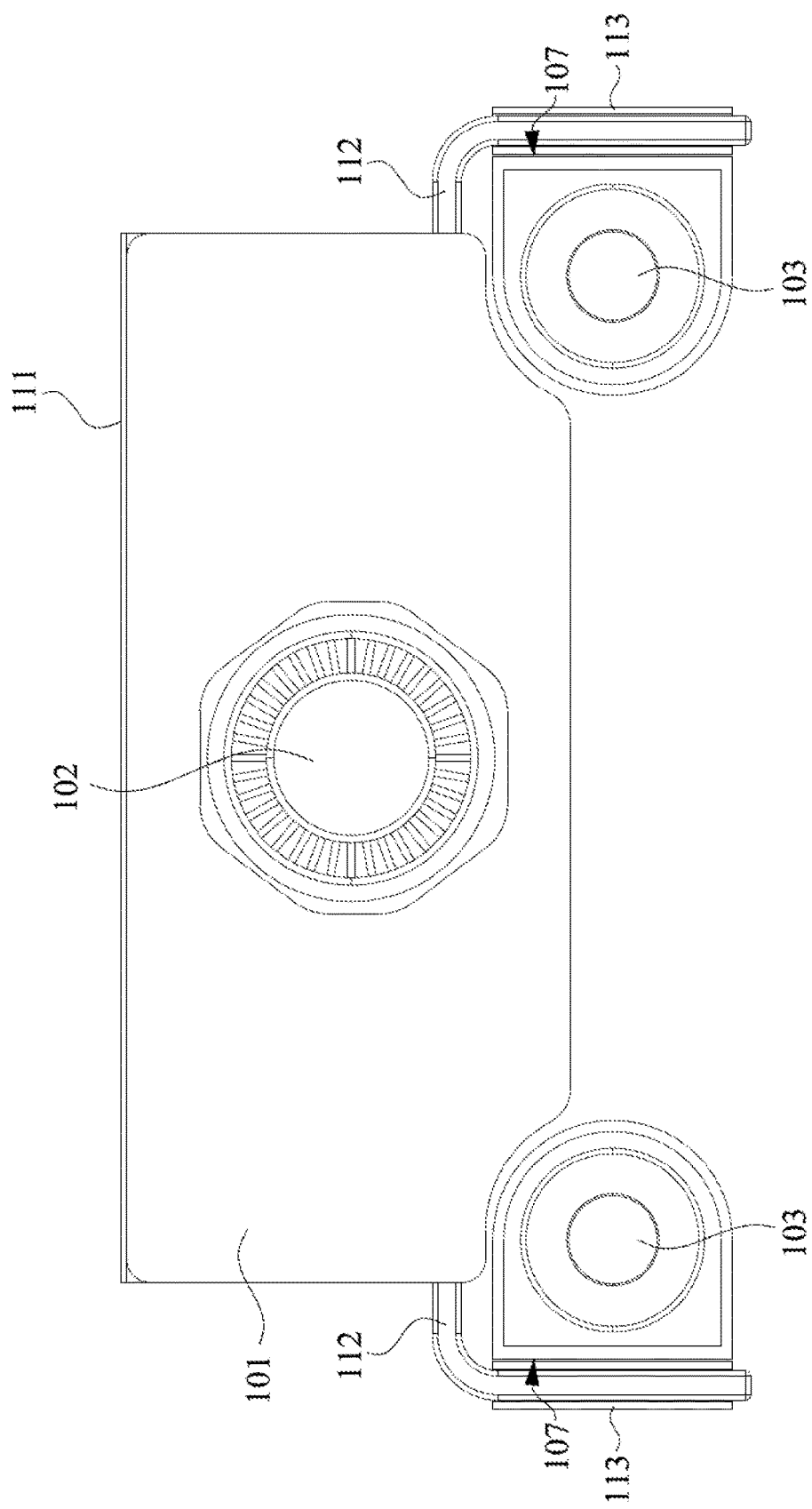
FIG. 6 is a top view of a heat dissipating system according to another embodiment of the present disclosure.

For example, FIG. 6 illustrates a top view of a heat dissipating system 200' according to some other embodiments of the present disclosure. As shown in FIG. 6, the heat dissipating system 200' includes one thermal conduction component 101, one first heat dissipation device 102, two second heat dissipation devices 103, one heat exchanger 111, two heat conducting elements 112, and two heat exchangers 113. Specifically, the first heat dissipation device 102 blows cold air in different outlet directions to the thermal conduction component 101. The cold air facilitates the heat dispersion throughout the thermal conduction component 101. Meanwhile, the heat conducting elements 112 guide part of the heat of the thermal conduction component 101 to the side air outlet openings 107 of the second heat dissipation devices 103. Then, the cold air introduced by the second heat dissipation devices 103 exchange heats with the heat exchangers 113 (for example, heat dissipating fins). The heat exchanger 113 can increase the heat convection and radiation area, thereby improving the heat dissipation efficiency.

Figure 7:
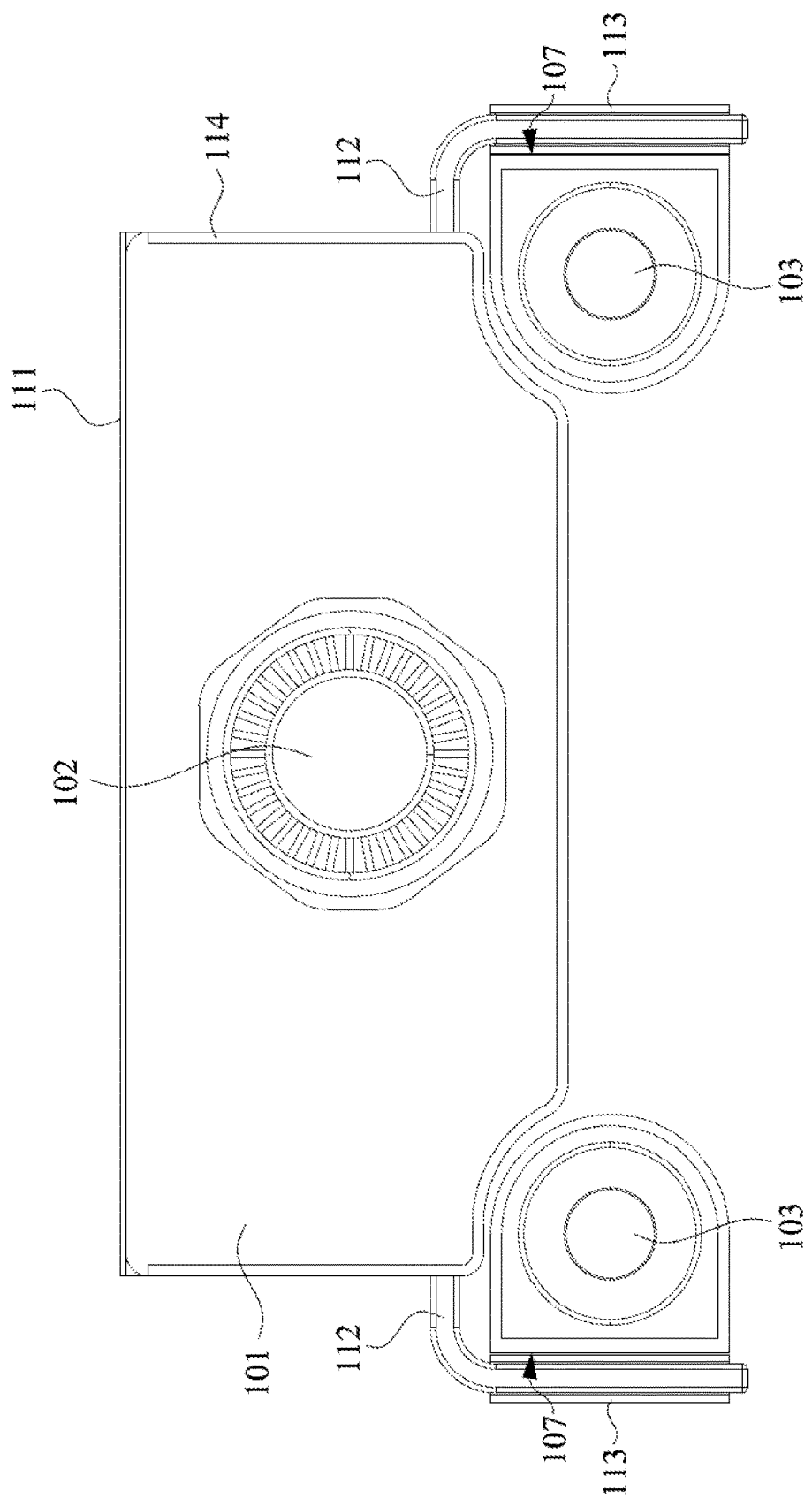
FIG. 7 is a top view of a heat dissipating system according to another embodiment of the present disclosure.

Reference is made to FIG. 7. FIG. 7 illustrates a top view of a heat dissipation system 200" according to some other embodiments of the present disclosure. In some embodiments, the heat dissipation system 200" further includes a first block body 114 to hinder the heat transfer among the second heat dissipation device 103 and portions of the thermal conduction component 101 adjacent to the second heat dissipation devices 103. The first block body 114 enhances the separation of the (thermal) flow fields of the first heat dissipation device 102 and the second heat dissipation devices 103. Therefore, unnecessary heat transfer may reduce, which prevents the hot air from circulating in the system and avoid the subsequent decrease in heat dissipation efficiency. For example, a first block body 114 is disposed around an edge of the thermal conduction component 101, as shown in FIG. 7. As mentioned above, the thermal conduction component 101 can be a vapor chamber, a heat pipe, a graphite sheet, a highly conductive metal, a combination thereof, or the like. Therefore, the first block body 114 can have different configurations according to the structure of the thermal conduction component 101 while maintaining within the scope of this disclosure.

According to the foregoing recitations of the embodiments of the disclosure, it may be seen that in the heat dissipating system of the present disclosure, with the first heat dissipation device generating the first working fluid, the thermal conduction component disperses the heat from the heat source. The second heat dissipation device further generates the second working fluid to direct the heat along some specific directions. The heat conducting elements extending from the thermal conduction component further disperse the heat from the thermal conduction component and guide the heat to paths through which the second working fluid passes. In addition, the first block body between the thermal conduction component and the second heat dissipation device enables the first and second heat dissipation devices to have independent (thermal) flow fields. Therefore, unnecessary heat transfer may reduce, which prevents the hot air from circulating in the system and avoid the subsequent decrease in heat dissipation efficiency. Overall, compared with the present heat dissipating systems commonly used, the heat dissipating system of the present disclosure can enhance heat dissipation and prevent overheating of electronic devices.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A heat dissipating system for electronic devices, comprising:
    an open-type centrifugal fan;
    a thermal conduction plate disposed around the open-type centrifugal fan; and
    two enclosed-type centrifugal fans disposed at two corners of the thermal conduction plate, wherein the two enclosed-type centrifugal fans have respective side air outlet openings, and the side air outlet openings of the two enclosed-type centrifugal fans face away from each other and face toward opposite directions.

2. The heat dissipating system of claim 1, wherein the open-type centrifugal fan comprises at least one axial air inlet opening and a plurality of radial air outlet openings.

3. The heat dissipating system of claim 1, wherein the thermal conduction plate fully encircles the open-type centrifugal fan.

4. The heat dissipating system of claim 1, wherein the thermal conduction plate partially encircles the open-type centrifugal fan.

5. The heat dissipating system of claim 1, further comprising two heat conducting elements protruding from the two corners of the thermal conduction plate.

6. The heat dissipating system of claim 5, further comprising two heat dissipating fins disposed on the two heat conducting elements respectively, the side air outlet openings of the two enclosed-type centrifugal fans face the two heat dissipating fins respectively.

7. The heat dissipating system of claim 1, wherein the open-type centrifugal fan is disposed between the two enclosed-type centrifugal fans.

8. The heat dissipating system of claim 1, further comprising a heat-transfer-hindering block body disposed around an edge of the thermal conduction plate, wherein the heat-transfer-hindering block body is disposed between the open-type centrifugal fan and the two enclosed-type centrifugal fans.

* * * * *